United States Patent

Tanaka et al.

[11] Patent Number: 5,980,306
[45] Date of Patent: Nov. 9, 1999

[54] ELECTRICAL CONNECTION BOX

[75] Inventors: Mitsuo Tanaka; Shin Hasegawa; Yoshiaki Sawaki, all of Hikone; Tadashi Ikezawa, Nagahama; Kazuo Miyajima, Ohmihachiman; Wataru Suehiro, Hikone, all of Japan

[73] Assignee: The Furukawa Electric Co., Ltd., Tokyo, Japan

[21] Appl. No.: 08/959,020

[22] Filed: Oct. 28, 1997

[30] Foreign Application Priority Data

Oct. 31, 1996 [JP] Japan .................................. 8-290138

[51] Int. Cl.⁶ .................................................. H01R 13/00
[52] U.S. Cl. .................................................. 439/485
[58] Field of Search .................. 439/485, 949, 439/76.2

[56] References Cited

U.S. PATENT DOCUMENTS 3,605,074  9/1971  Freggens et al. .
5,797,763  8/1998  Saka et al. ........................ 439/485

FOREIGN PATENT DOCUMENTS 4-131120  12/1992  Japan .
1400608   7/1975   United Kingdom .
1531972  11/1978   United Kingdom .
1585534   3/1981   United Kingdom .

*Primary Examiner*—Steven L. Stephan
*Assistant Examiner*—Eugene G. Byrd
*Attorney, Agent, or Firm*—Frishauf, Holtz, Goodman, Langer & Chick, P.C.

[57] ABSTRACT

An electrical connection box has electronic components mounted therein and includes a heat pipe for radiating heat generated from the electronic components to the outside. The heat pipe has a heat absorbing portion inside the connection box and a heat radiating portion outside the connection box. The heat pipe is formed of an electrically conductive material, and an electrically conductive heat collecting member is provided for collecting the heat generated from the electronic components. The heat absorbing portion of the heat pipe is connected to the heat collecting member, and a grounding current is supplied to the heat pipe and the heat collecting member.

4 Claims, 5 Drawing Sheets

ELECTRICAL CONNECTION BOX

BACKGROUND OF THE INVENTION

1. Field of the Invention

The present invention relates to an electrical connection box.

2. Description of the Related Art

In electrical connection boxes, e.g., automotive electrical connection boxes mounted with various electronic components, such as a relay, fuses, etc., the components generate heat as they are operated. In order to lower and equalize the internal temperature, one such known electrical connection box is provided with a heat collecting member and a heat pipe (Jpn. UM Appln. KOKAI Publication No. 4-131120).

The heat pipe is a sealed tubular body that is hermetically injected with a hydraulic fluid. One half of the heat pipe functions as a heat absorbing portion and the other as a heat radiating portion as the hydraulic fluid is evaporated and liquefied.

The electrical connection box is mounted with various electronic components, as mentioned before, and also comprises various busbars and insulating plates that constitute electric circuits and grounded circuits. Because the connection box requires the use of a lot of components, the connection box is liable to become large-sized. And although the heat pipe is effective as a means for lowering and equalizing the temperature in the connection box, it is more expensive than any other similar means, so that it entails an increase in cost of the connection box.

SUMMARY OF THE INVENTION

The object of the present invention is to provide an electrical connection box which is restrained from being large-sized and which uses a heat pipe without entailing an increase in cost.

In order to achieve the above object, according to the present invention, there is provided an electrical connection box comprising electronic components mounted therein and a heat pipe for radiating heat generated from the electronic components to the outside, the heat pipe having a heat absorbing portion inside the connection box and a heat radiating portion outside, in which the heat pipe is formed of an electrically conductive material, an electrically conductive heat collecting member is provided for collecting the heat generated from the electronic components, the heat absorbing portion of the heat pipe is connected to the heat collecting member, and a grounding current is supplied to the heat pipe and the heat collecting member.

Preferably, the heat collecting member is provided with a terminal connected to a ground circuit.

Preferably, moreover, the heat radiating portion of the heat pipe is connected electrically to a mounting portion on which the electrical connection box is mounted.

According to the electrical connection box of the invention, the heat pipe is a multifunctional component that serves also as a grounded circuit, so that there is no need to provide any busbar for a separate grounded circuit.

According to the invention, there may be provided an electrical connection box that can be restrained from being large-sized, and that can use a heat pipe without entailing an increase in cost.

Since the heat collecting member is provided with the terminal connected to the ground circuit, it can be used directly as a grounded circuit, so that an increase in number of the requisite components of the electrical connection box can be restrained.

Since the heat radiating portion of the heat pipe is connected electrically to the mounting portion on which the electrical connection box is mounted, moreover, the connection box can be grounded through the body of an automobile when it is mounted in the vehicle.

The above and other objects, features, and advantages of the invention will be more apparent from the ensuing detailed description taken in connection with the accompanying drawings.

DETAILED DESCRIPTION OF THE PREFERRED EMBODIMENTS

Figure 1:
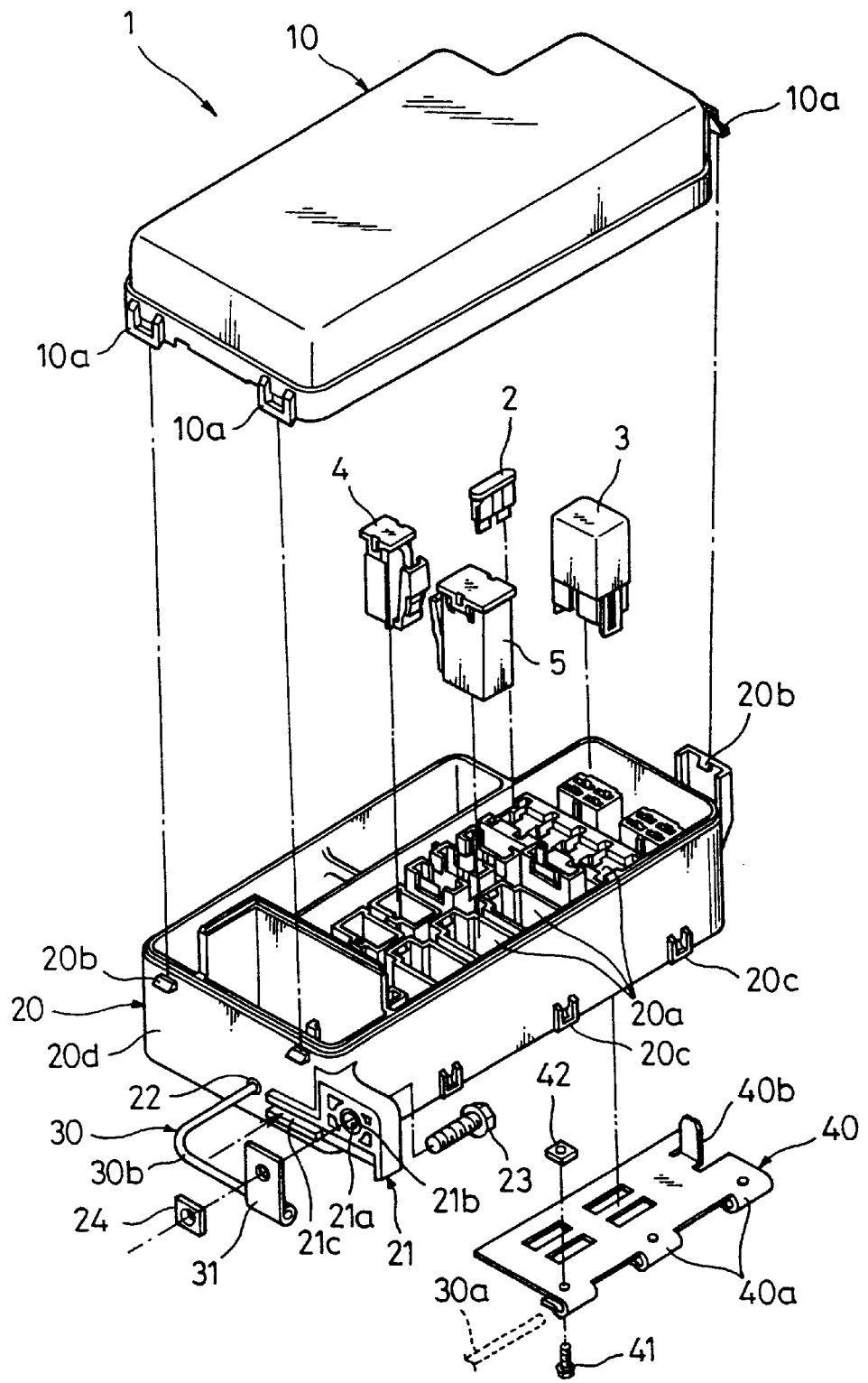
FIG. 1 is an exploded perspective view showing an arrangement of an electrical connection box according to the present invention.
Figure 2:
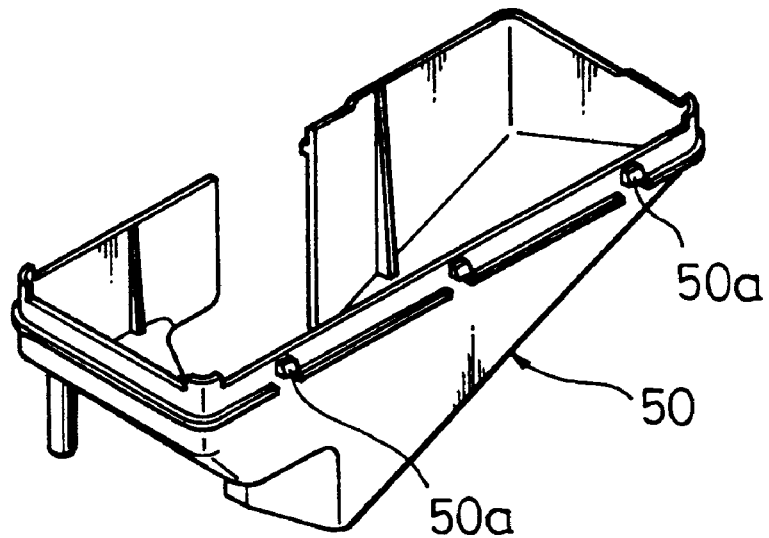
FIG. 2 is a perspective view of a lower cover used in the connection box of FIG. 1.
Figure 3:
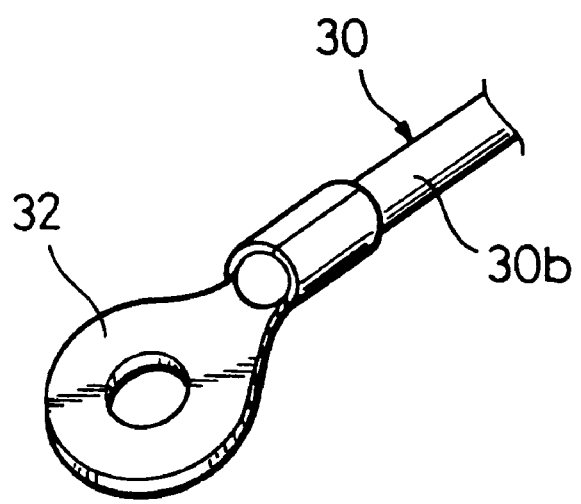
FIG. 3 is a perspective view showing an automotive circular-plate terminal attached to a heat radiating portion of a heat pipe.

Referring now to FIGS. 1 to 3, one embodiment of an automotive electrical connection box according to the present invention will be described in detail.

As shown in FIGS. 1 and 2, an electrical connection box 1 comprises an upper cover 10, base box 20, heat pipe 30, heat sink 40, and lower cover 50.

As shown in FIG. 1, the upper cover 10 can be fitted on the base box 20, and has engaging portions 10a in suitable positions.

Defined in the base box 20 are a large number of mounting portions 20a of various shapes in which are mounted various electronic components, including an auto-fuse 2, relay 3, first main fuse 4, second main fuse 5, etc. Arranged in suitable positions on the side faces of the box 20 are hooks 20b, which can engage the engaging portions 10a of the upper cover 10, individually. The base box 20 is open-bottomed, and a heat absorbing portion 30a (mentioned later) of the heat pipe 30 is exposed to the bottom side of the box 20 when it is inserted in the box 20. Further, the base box 20 is provided with engaging portions 20c in suitable positions at the lower part of one of its side faces. A mounting bracket 21 to be attached to the body of an automobile protrudes outward in the crosswise direction from a side wall 20d of the box 20. The mounting bracket 21 is formed with a bolt hole 21b, which is fitted with a metallic collar 21a therein, and a groove-shaped attachment portion 21c to which the heat pipe 30 is attached.

As is generally known, the heat pipe 30 comprises a metallic pipe that is hermetically sealed at both ends and contains a compressed hydraulic fluid sealed therein. The fluid in the pipe 30 is evaporated by heat absorption on the side of the heat absorbing portion 30a. The evaporated fluid moves to a heat radiating portion 30b at low temperature, whereupon it is liquefied by heat radiation in the radiating portion 30b, and then returns to the absorbing portion 30a. The heat pipe 30 is inserted into the base box 20 in a through hole in the side wall 20d of the box 20. The heat absorbing portion 30a and the heat radiating portion 30b of the pipe 30 are located inside and outside, respectively, of the electrical connection box 1. When inserting the heat pipe 30, a sealing member 22 may be previously fitted in the through hole to permit the heat pipe 30 to be inserted through the sealing member 22, and in this case, waterproofing of the electrical connection box 1 is ensured. The heat pipe 30 is made of an electrically conductive material such as copper, copper alloy, stainless steel or aluminum, and a copper plate 31, which serves both as a radiator and a ground plate, is fixed to the heat radiating portion 30b by binding. As the aforesaid processes of operation are repeated, the heat pipe 30 conveys heat from the absorbing portion 30a to the radiating portion 30b with very high efficiency. Thus, heat generated from the various electronic components in the electrical connection box 1, including the auto-fuse 2, relay 3, etc., can be radiated to the outside through the heat pipe 30 so as to maintain the functions of the electronic components.

The heat sink 40, which is formed of an electrically conductive material such as copper, copper alloy, brass or stainless steel, is a heat collecting member that collects the heat generated from the auto-fuse 2, relay 3, etc. in the electrical connection box 1. The heat sink 40 is formed with a plurality of binding pieces 40a for fixing the heat absorbing portion 30a of the heat pipe 30 inserted in the base box 20, on one of its long sides, and an earth terminal 40b on one of its short sides.

The lower cover 50 is attached to the lower part of the base box 20, and is formed with hooks 50a in positions corresponding individually to the engaging portions 20c of the box 20, as shown in FIG. 2.

In the electrical connection box 1 of the present invention constructed in this manner, the various electronic components, such as the auto-fuse 2, relay 3, etc., are mounted in the mounting portions 20a of the base box 20, and the heat absorbing portion 30a of the heat pipe 30 is inserted into the box 20 in the through hole in the side wall 20d. As this is done, the heat radiating portion 30b of the pipe 30 is attached to the attachment portion 21c of the mounting bracket 21. Thereupon, the copper plate 31 comes into contact with a side face of the bracket 21 in a manner such that a bolt hole formed in its center is in alignment with the bolt hole 21b. Then, a bolt 23 is inserted into the bolt hole 21b, and the copper plate 31, along with the heat radiating portion 30b, is fixed to the bracket 21 by means of a nut 24.

Subsequently, the heat absorbing portion 30a of the heat pipe 30 is fixed by means of the binding pieces 40a so that it is connected to the heat sink 40, and the sink 40 is attached to the base box 20 from below. Thereupon, the earth terminal 40b of the heat sink 40 projects toward the mounting portions 20a of the base box 20, and a ground circuit (not shown) is connected to the terminal 40b. The ground circuit causes a grounding current (e.g., about 1 to 5 amperes) to flow into the heat sink 40 and the heat pipe 30 through the terminal 40b. At this time, the heat absorbing portion 30a may be fixed more securely by means of bolts 41, which are passed individually through bolt holes in the binding pieces 40a of the heat sink 40, and nuts 42, as shown in FIG. 1.

Then, the upper cover 10 is mounted on the base box 20 in a manner such that the engaging portions 10a are in engagement with the hooks 20b, individually. Also, a given number of laminate busbars and insulating plates (both not shown) are attached to the base box 20 from below, and the lower cover 50 is mounted on the lower part of the box 20, whereupon assembling the electrical connection box 1 is completed.

The electrical connection box 1, constructed in this manner, is mounted on a suitable portion of the vehicle body by means of a bolt 23 and a nut 24 attached to the mounting bracket 21.

Thus, in the electrical connection box 1, the heat generated from the various electronic components, such as the auto-fuse 2, relay 3, etc., can be collected in the heat sink 40 and radiated to the outside through the heat pipe 30, so that the functions of the electronic components can be kept stable. In the connection box 1, moreover, the grounding current flows from the ground circuit, which is connected to the earth terminal 40b, toward the vehicle body through the heat sink 40 and the heat pipe 30. Unlike conventional electrical connection boxes, therefore, the connection box 1 need not be provided with any special busbar for a grounded circuit. Thus, the requisite components of the electrical connection box 1 of the invention can be reduced in number, so that the box can be restrained from becoming large-sized.

According to the embodiment described above, the heat pipe 30 is grounded by being connected electrically to the vehicle body through the copper plate 31 that is fixed to the heat radiating portion 30b. It is to be understood, however, that the heat pipe 30 may be connected to the vehicle body by attaching an automotive circular-plate terminal (LA terminal) 32 to the heat radiating portion 30b, as shown in FIG. 3, for example.

According to the foregoing embodiment, moreover, the heat pipe and the heat sink may be connected by means of rivets or bolts and nuts, as well as by binding. The pipe and the sink can be connected more efficiently if their junctions are provided with dimples. The dimples can ensure satisfactory point contact between the heat pipe and the heat sink and reliable electrical contact for the case where the grounding current is supplied.

Also, where the heat pipe 30 is inserted via the sealing member 22 into the through hole formed in the side wall 20d of the base box 20, waterproofing of the electrical connection box 1 can be enhanced.

If it is difficult to attach the heat pipe horizontally to the electrical connection box of the invention in the case where the box is mounted in a vehicle that is specified for cold districts, a sleeve should be provided at least on the lower end portion of the heat pipe. If this is done, the sleeve can prevent the hydraulic fluid from freezing and causing the heat pipe to expand.

On the other hand, the electrical connection box arranged in this manner may be designed so that the heat absorbing portion of the heat pipe can be very easily held in position by means of a busbar without using any exclusive jig, whereby the cost of operation for retaining the heat pipe can be reduced. In electrical connection boxes comprising first and second mating casings, a busbar connecting electronic components arranged in the first and second casings, and a heat pipe having a heat collecting portion inside the casings and a heat radiating portion outside, the busbar is formed integrally with retaining portions for removably holding the heat pipe in position.

Referring now to FIGS. 4 to 8, one such electrical connection box will be described.

Figure 4:
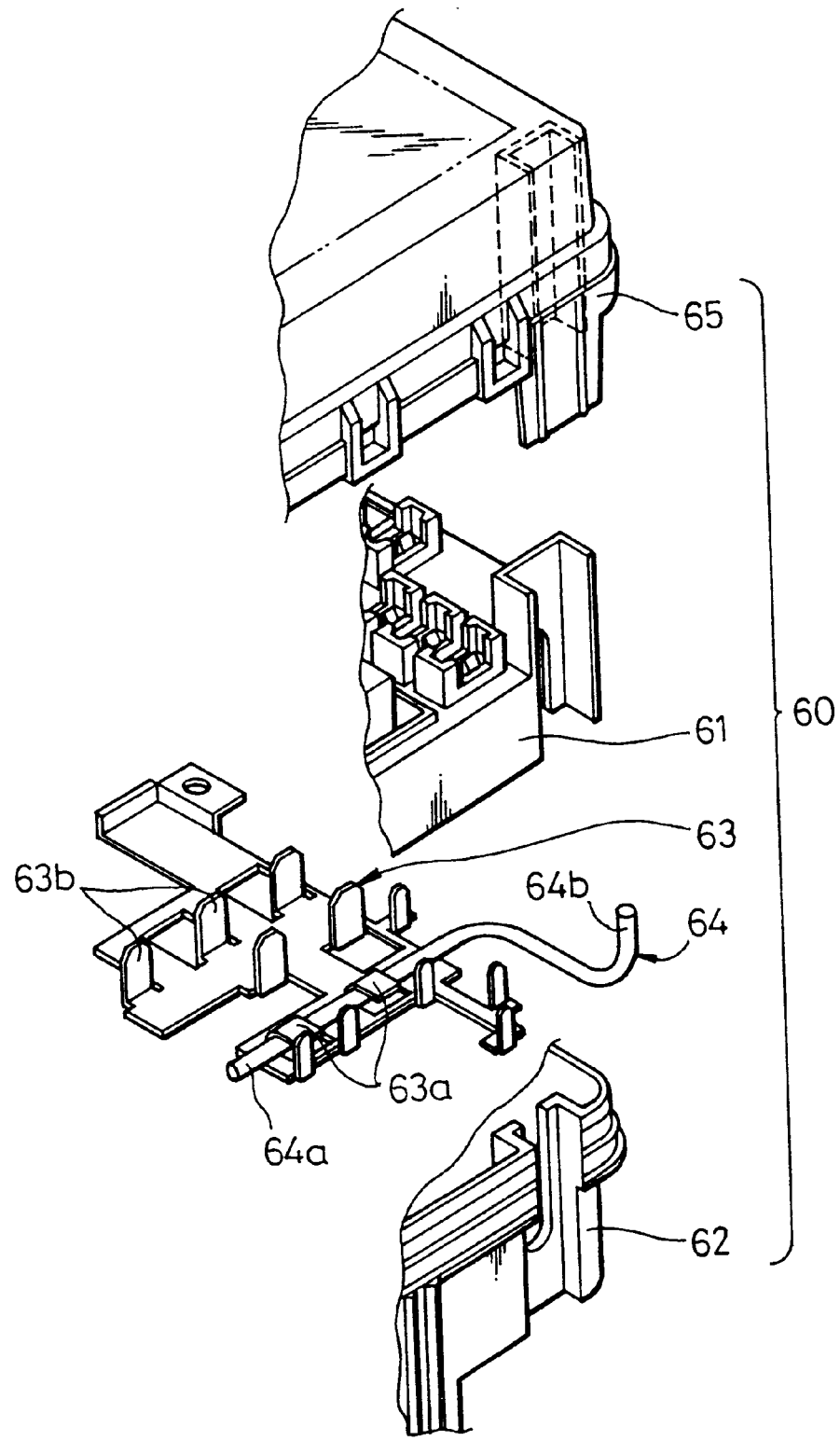
FIG. 4 is an exploded perspective view partially showing components of an electrical connection box designed so that a heat absorbing portion of the heat pipe can be very easily held in position by means of a busbar without using any exclusive jig, whereby the cost of operation for retaining the heat pipe can be reduced.

As shown in FIG. 4, an electrical connection box 60 comprises upper and lower mating casings 61 and 62, a busbar 63 that connects electronic components (not shown) arranged in the casings 61 and 62, and a heat pipe 64 having a heat collecting portion 64a inside the casings 61 and 62 and a heat radiating portion 64b outside. An upper cover 65 is put on the upper casing 61, out of the two mating casings 61 and 62. The connection box 60 is designed so that the upper and lower casings 61 and 62 can be joined and locked together to press down the busbar 63.

Constructed in this manner, the electrical connection box 60 is characterized in that the busbar 63 is formed integrally with retaining portions 63a for removably holding the heat collecting portion 64a of the heat pipe 64.

Figure 5:
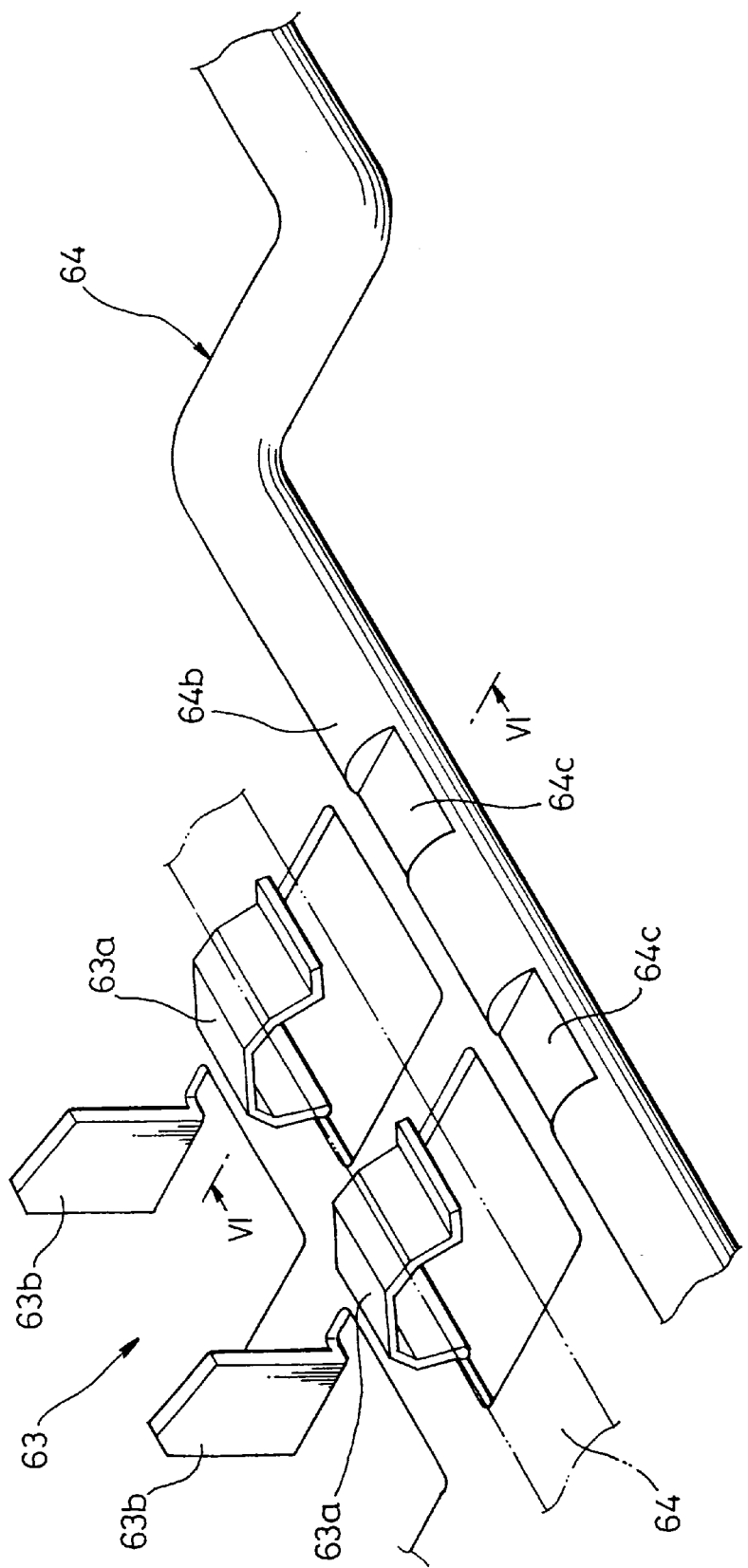
FIG. 5 is a perspective view for illustrating the way the heat pipe is held in position by means of the busbar used in the connection box of FIG. 4.

The busbar 63 is previously designed in a given shape, depending on the layout of the electronic components, such as fuses, relay, etc., in the casings 61 and 62, such that tabs 63b are formed integrally with the retaining portions 63a in predetermined positions by pressing, as shown in FIGS. 4 and 5. Preferably, the busbar 63 should be formed of a metallic material with high thermal conductivity, e.g., brass or alloyed copper. Alternatively, however, the busbar 63 may be formed of any electrically conductive resin material that has high thermal conductivity. It is to be desired, moreover, that the retaining portions 63a should be formed in positions such that the heat pipe 64 can cool the busbar 63 most effectively. As shown in FIG. 5, each retaining portion 63a is in the form of a polygonal bent piece corresponding to the external shape of the heat pipe 64, and its distal end side is raised away from the basic plane of the busbar 63.

As shown in FIG. 5, the heat collecting portion 64a of the heat pipe 64 is formed with flattened retaining surfaces 64c in positions opposite and corresponding to the retaining portions 63a, individually. The cross-sectional shape of the heat pipe 64 is not limited to a specific one, and may be circular or elliptic only if the pipe 64 can fulfill its function.

Figure 6:
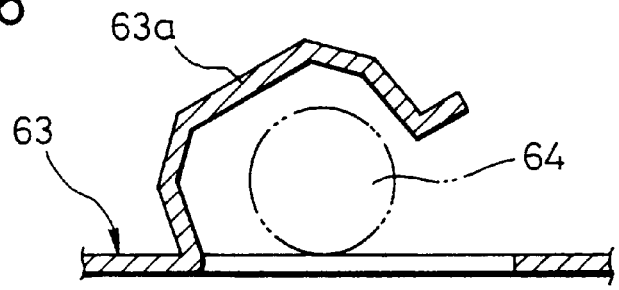
FIG. 6 is a sectional view taken along line VI—VI of FIG. 5.

If the retaining surfaces 64c are caused to engage their corresponding retaining portions 63a as the heat pipe 64 is slid onto the busbar 63 through the distal end side of the retaining portions 63a, as shown in FIG. 5, therefore, the heat collecting portion 64a can be very easily held in position by means of the busbar 63, as shown in FIG. 6, without using any exclusive jig.

Figure 7:
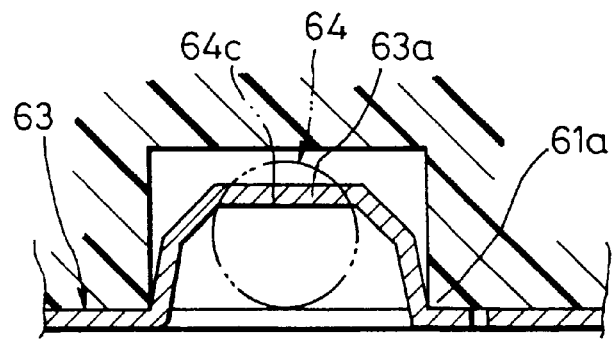
FIG. 7 is a sectional view showing the heat pipe fixed to the busbar with a retaining portion pressed by a press portion formed on an upper casing.

In this state, as shown in FIG. 6, the distal end side of each retaining portion 63a is lifted. If the lower surface of the upper casing 61 is formed with press portions 61a in positions corresponding to the respective distal ends of the retaining portions 63a, as shown in FIG. 7, however, the press portions 61a can hold down the distal ends of the retaining portions 63a so that the heat pipe 64 can be fixed very easily to the busbar 63 when the upper casing 61 is fitted on the lower casing 62.

The press portions 61a are not necessary, however, only if the retaining portions 63a can securely hold the heat collecting portion 64a of the heat pipe 64. For example, the retaining portions 63a may be pressed directly by means of the casing so as to bring the retaining portions 63a into close contact with the respective retaining surfaces 64c.

Figure 8A:
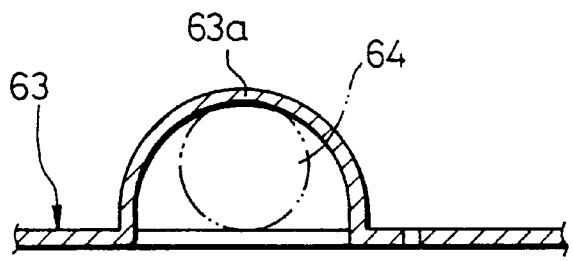
FIGS. 8A and 8B are sectional views showing retaining portions of alternative shapes.
Figure 8B:
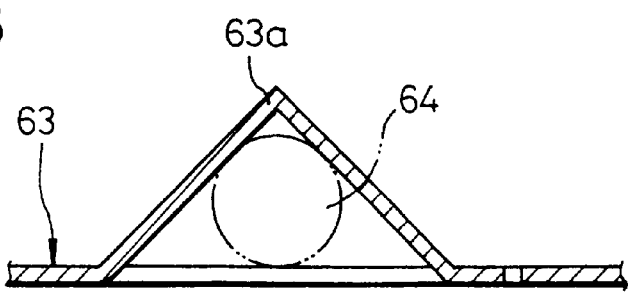

Further, the retaining portions 63a may be curved in a semicircular form, as shown in FIG. 8A, or in a triangular form, as shown in FIG. 8B, for example, only if they can hold the heat pipe 64 in position.

In the electrical connection box 60 constructed in this manner, when the two casings 61 and 62 are joined together, the retaining portions 63a are pressed, thereby fixing the heat pipe 64 to the busbar 63, so that the pipe 64 can be securely held in position by means of the busbar 63. Thus, the electrical connection box 60 can be effectively used for an automobile in which it is subjected to vibration as the vehicle runs.

In cases where resiliency of the retaining portions 63a can be used for the purpose of fixing the heat pipe 64 in position, it is of course unnecessary to press the retaining portions 63a with the casing. Alternatively, after the heat collecting portion 64a is set in position, the operator may press the retaining portions 63a to bring them into close contact with the corresponding retaining surfaces 64c.

In the electrical connection box 60 according to the embodiment described above, the busbar 63 is formed with the retaining portions 63a for removably holding the heat collecting portion 64a of the heat pipe 40. In the case where the electrical connection box is provided with a heat collecting plate (heat sink) for collecting heat from the busbar, however, the retaining portions of the heat pipe may be formed on the heat collecting plate, not on the busbar.

Although the retaining portions described in connection with the above embodiment are two in number, moreover, they are not particularly limited in number, as long as they can hold the heat pipe in position. It is to be understood, furthermore, that the busbar is not limited to the single-layer structure, and may be a laminate structure comprising a plurality of layers.

What is claimed is:

1. An electrical connection box in which electronic components may be mounted, said electrical connection box comprising:

a heat pipe for radiating heat generated from the electrical components to outside the electrical connection box, said heat pipe having a heat absorbing portion inside the electrical connection box and a heat radiating portion outside the electrical connection box; and an electrically conductive heat collecting member, connected to the heat absorbing portion of the heat pipe, for collecting the heat generated from the electrical components;

wherein the heat pipe is formed of an electrically conductive material, and a grounding current is supplied to the heat pipe and the heat collecting member.

2. The electrical connection box according to claim 1, wherein said heat collecting member comprises a terminal connected to a ground circuit.

3. The electrical connection box according to claim 1, further comprising a mounting member for mounting the electrical connection box on a body, wherein said heat radiating portion of said heat pipe is electrically connected to the mounting member.

4. The electrical connection box according to claim 2, further comprising a mounting member for mounting the electrical connection box on a body, wherein said heat radiating portion of said heat pipe is electrically connected to the mounting member.

* * * * *